United States Patent [19]
Jones et al.

[11] Patent Number: 6,016,033
[45] Date of Patent: Jan. 18, 2000

[54] ELECTRODE STRUCTURE FOR HIGH RESOLUTION ORGANIC LIGHT-EMITTING DIODE DISPLAYS AND METHOD FOR MAKING THE SAME

[75] Inventors: Gary W. Jones; Webster E. Howard, both of Lagrangeville; Steven M. Zimmerman, Pleasant Valley, all of N.Y.

[73] Assignee: Fed Corporation, Hopewell Junction, N.Y.

[21] Appl. No.: 09/073,798

[22] Filed: May 7, 1998

Related U.S. Application Data

[60] Provisional application No. 60/052,347, Jul. 11, 1997.

[51] Int. Cl.⁷ .................................................... H05B 33/12
[52] U.S. Cl. ......................... 313/506; 313/503; 313/504; 313/512; 428/917
[58] Field of Search .................................... 313/500, 503, 313/504, 505, 512, 506; 428/690, 917

[56] References Cited

U.S. PATENT DOCUMENTS

| | | | |
|---|---|---|---|
| 4,963,788 | 10/1990 | King et al. | 313/503 |
| 5,059,861 | 10/1991 | Littman et al. | 313/503 |
| 5,478,658 | 12/1995 | Dodabalapur et al. | 428/690 |
| 5,521,465 | 5/1996 | Budzilek et al. | 313/503 |
| 5,646,480 | 7/1997 | Carroll et al. | 313/503 |
| 5,811,177 | 9/1998 | Shi et al. | 428/209 |

*Primary Examiner*—Ashok Patel
*Attorney, Agent, or Firm*—Collier, Shannon, Rill & Scott, PLLC

[57] ABSTRACT

The present invention is directed to an electrode structure for an organic light-emitting device display. The electrode structure includes a transparent electrode and a high conductivity rib. The structure provides top side light output and a low line resistance, and enables a high resolution display. The structure permits a display to be built on top of a silicon driver chip for active matrix addressing.

24 Claims, 2 Drawing Sheets

ELECTRODE STRUCTURE FOR HIGH RESOLUTION ORGANIC LIGHT-EMITTING DIODE DISPLAYS AND METHOD FOR MAKING THE SAME

CROSS REFERENCE TO RELATED APPLICATIONS

This application relates to and claims priority on prior U.S. Provisional Application Ser. No. 60/052,347, filed on Jul. 11, 1997.

FIELD OF THE INVENTION

The present invention relates to organic light-emitting devices, and in particular, to an electrode structure for a high-resolution organic light-emitting diode ("OLED") display device.

BACKGROUND OF THE INVENTION

EL devices, which may be generally classified as organic or inorganic, are well known in the graphic display and imaging art. Among the benefits of organic EL devices, such as organic light-emitting diodes, are high visibility due to self-emission, as well as superior impact resistance, and ease of handling of the solid state devices. OLEDs may have practical application for television and graphic displays, as well as in digital printing applications.

An OLED is typically a laminate formed on a substrate such as soda-lime glass. A light-emitting layer of a luminescent organic solid, as well as adjacent semiconductor layers, are sandwiched between a cathode and an anode. The semiconductor layers may be hole-injecting and electron-injecting layers. The light-emitting layer may be selected from any of a multitude of fluorescent organic solids. The light-emitting layer may consist of multiple sublayers.

When a potential difference is applied across the cathode and anode, electrons from the electron-injecting layer, and holes from the hole-injecting layer are injected into the light-emitting layer. They recombine, emitting light.

In a typical matrix-addressed OLED display, numerous OLEDs are formed on a single substrate and arranged in groups in a regular grid pattern. Several OLED groups forming a column of the grid may share a common cathode, or cathode line. Several OLED groups forming a row of the grid may share a common anode, or anode line. The individual OLEDs in a given group emit light when their cathode line and anode line are activated at the same time.

OLEDs have a number of beneficial characteristics. These include a low activation voltage (about 5 volts), fast response when formed with a thin light-emitting layer, and high brightness in proportion to the injected electric current. By changing the kinds of organic solids making up the light-emitting layer, many different colors of light may be emitted, ranging from visible blue, to green, yellow, and red. OLEDs are currently the subject of aggressive investigative efforts.

An OLED may be designed to be viewed either from the "top"—the face opposite the foundational substrate—or from the "bottom", i.e., through the substrate, from the face opposite the light emitting layer. Whether the OLED is designed to emit light through the top or the bottom, the respective structure between the viewer and the light emitting material needs to be sufficiently transparent, or at least semi-transparent, to the emitted light. In many applications it is advantageous to employ an OLED display having topside light output. This permits the display to be built on top of a silicon driver chip for active matrix addressing.

It has been a continuing challenge to devise OLED display structures which provide topside light output while minimizing light blockage and thereby permitting a high-resolution display. Transparent conductors deposited on top of organics, at low temperature, tend to be excessively resistive. This adversely affects the response time of the device or peak brightness. Various methods have been tried including transparent conductors (e.g., ITO and IZO) on thin metal.

Accordingly, there is a need for a top electrode structure for an OLED which permits high resolution displays to be fabricated with low line resistance and topside light output. The present invention meets these needs, and provides other benefits as well.

OBJECTS OF THE INVENTION

It is therefore an object of the present invention to provide an electrode structure for high resolution OLED displays.

It is another object of the present invention to provide a method for making a topside electrode structure for high resolution OLED display.

It is another object of the present invention to provide an electrode structure for an OLED which has low line resistance.

It is a further object of the present invention to provide an electrode structure for an OLED having topside light output.

It is still another object of the present invention to provide an electrode structure for an OLED which permits an OLED display to be built on top of a silicon driver chip for active matrix addressing.

It is yet another object of the present invention to provide a top electrode structure for an OLED which is compatible with solvent or water-soluble OLED displays.

It is another object of the present invention to provide a process for making a top electrode structure for high-resolution OLED displays having low line resistance.

It is yet another object of the present invention to provide a method for making a top electrode structure for a high resolution OLED display with topside light output.

Additional objects and advantages of the invention are set forth, in part, in the description which follows, and, in part, will be apparent to one of ordinary skill in the art from the description and/or from the practice of the invention.

SUMMARY OF THE INVENTION

In response to the foregoing challenges, applicants have developed an innovative top electrode structure for a high resolution organic light-emitting diode display device, and top electrode structure comprising a transparent electrode and conductive ribs disposed on the transparent electrode.

Applicants have also developed a top electrode structure for an OLED display device, the OLED display device comprising a substrate, a bottom electrode disposed on the substrate, and an organic light-emitting material disposed on the bottom electrode, the top electrode structure comprising a first conductive barrier disposed on the organic light-emitting material, a transparent electrode disposed on the first conductive barrier, a second conductive barrier disposed on the transparent electrode and highly conductive ribs disposed on the second conductive barrier.

Further, applicants have developed a top electrode structure for an OLED display device, the top electrode structure comprising conductive ribs, and a transparent electrode disposed on the conductive ribs.

The novel top electrode structure of the invention provides top side light output and a low line resistance and enables a high resolution display.

The present invention is directed to an organic light emitting diode device comprising a substrate, a first conductor located on the substrate, an organic light emitting layer located on the first conductor, and a second conductor located on the organic light emitting layer. The improved device according to the present invention includes at least one of the first conductor and the second conductor comprises a transparent electrode layer, and at least one conductive rib disposed on the transparent electrode layer.

The at least one conductive rib may formed from a highly conductive material. The highly conductive material may be formed from at least one material selected from the group consisting of Mo, Ti, $TiSi_2$, W, Ta, Al and alloys of Mo, Ti, $TiSi_2$, W, Ta, and Al.

The transparent electrode layer may comprise at least one material selected from the group consisting of InSnO, InZnO, and ZnO.

The at least one of the first conductor and the second conductor may further include a first conductive barrier located between the transparent electrode layer and the at least one conductive rib. The at least one of the first conductor and the second conductor may further include a second conductive barrier located between the organic light emitting layer and the transparent electrode.

According to an embodiment of the present invention, the second conductor may include the transparent electrode layer, and the at least one conductive rib disposed on the transparent electrode layer. The second conductor may further include a first conductive barrier located between the transparent electrode layer and the at least one conductive rib. The second conductor may further include a second conductive barrier located between the organic light emitting layer and the transparent electrode. The device may further include an encapsulation layer formed on the transparent electrode layer and the at least one conductive rib. The encapsulation layer may be formed from a material selected from the group consisting of SiC, diamond-like carbon and parylene. The material may be deposited by PECVD.

The first conductor layer may be formed from at least one material selected from the group consisting of Al, Cu and alloys of Al and Cu. The first conductor layer may further include an electron injection layer. The electron injection layer may include an injection material selected from the group consisting of alloys of Mg and Ag, alloys of Li and Al, LiF on Al, Sc on Al, and $Sc_2O_3$ on Al. The first conductor layer may further include a reflective layer.

According to another embodiment of the present invention, the first conductor may comprise the transparent electrode layer, and the at least one conductive rib disposed on the transparent electrode layer. The first conductor may further include a first conductive barrier located between the transparent electrode layer and the at least one conductive rib. The first conductor may further include a second conductive barrier located between the organic light emitting layer and the transparent electrode. The device may further include an encapsulation layer formed on the second conductor layer. The encapsulation layer may be formed from a material selected from the group consisting of SiC, diamond-like carbon and parylene. The material may be deposited by PECVD.

The second conductor layer may be formed from at least one material selected from the group consisting of Al, Cu and alloys of Al and Cu. The second conductor layer may further include an electron injection layer. The electron injection layer may include an injection material selected from the group consisting of alloys of Mg and Ag, alloys of Li and Al, LiF on Al, Sc on Al, and $Sc_2O_3$ on Al. The second conductor layer may further include a reflective layer.

The present invention is also directed to a display device. The display device may include at least one organic light emitting diode device. Each of the at least one organic light emitting diode device may comprise a substrate, a first conductor located on the substrate, an organic light emitting layer located on the first conductor, and a second conductor located on the organic light emitting layer. The at least one of the first conductor and the second conductor may comprise a transparent electrode layer, and at least one conductive rib disposed on the transparent electrode layer.

The device may include at least two organic light emitting diode devices, wherein the at least one of the first conductor and the second conductor are common to at least two of the organic light emitting diode devices.

It is to be understood that both the foregoing general description and the following detailed description are exemplary and explanatory only, and are not restrictive of the invention as claimed. The accompanying drawings, which are incorporated herein by reference and which constitute a part of this specification, illustrate certain embodiments of the invention, and together with the detailed description serve to explain the principles of the present invention.

BRIEF DESCRIPTION OF THE DRAWINGS

The invention will be described in conjunction with the following figures in which like reference numerals designate like elements and wherein.

DETAILED DESCRIPTION OF THE PREFERRED EMBODIMENTS

Figure 1:
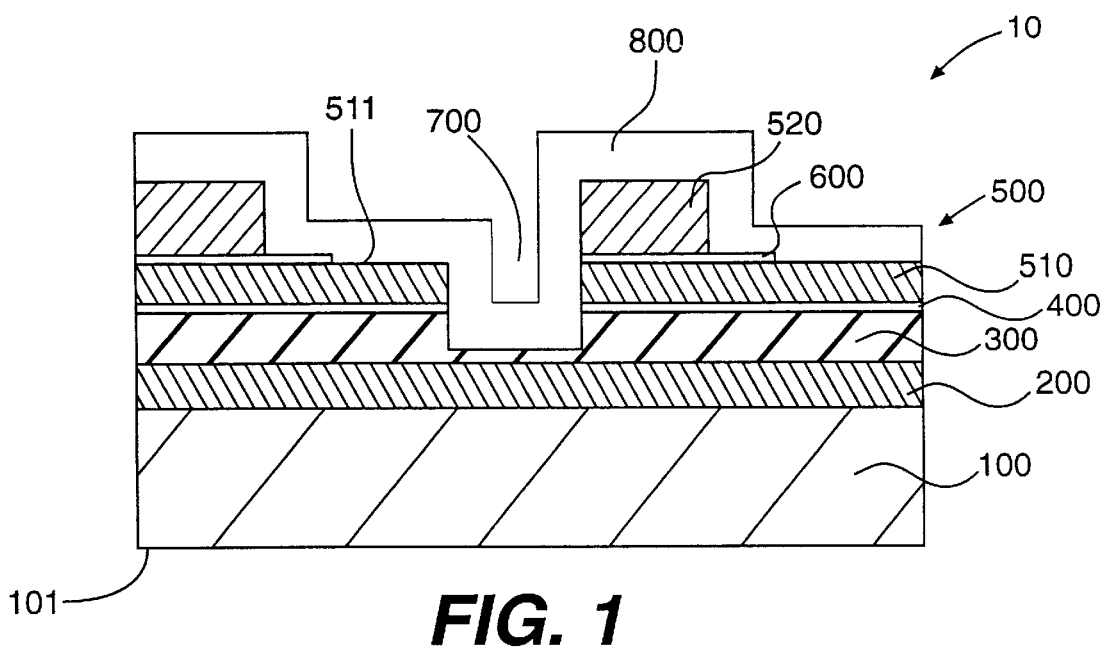
FIG. 1 is a cross sectional side view and elevation of a preferred embodiment of an OLED display device of the present invention.

Reference will now be made in detail to a preferred embodiment of the present invention, an example of which is illustrated in the accompanying drawings. A preferred embodiment of the present invention is shown in FIG. 1 as organic light-emitting diode display device 10.

In a preferred embodiment, OLED display device 10 comprises a substrate 100, a first conductor 200, an organic light-emitting stack 300, a first conductive barrier 400, a second conductor 500, a second conductive barrier 600, a channel 700 and an encapsulation layer 800. The second conductor 500 includes a transparent electrode 510 and at least one conductive rib 520.

As embodied herein, OLED display device 10 is a layered structure formed on substrate 100. The first conductor 200 is disposed on the substrate 100, the organic light-emitting stack 300 is disposed on bottom conductor 200. The first conductive barrier layer 400 is disposed on organic light-emitting stack 300. The second conductor 500 is disposed on the first conductive barrier layer 400. The second conductive barrier layer 600 is disposed on transparent electrode 510. The at least one conductive rib 520 is disposed on the second conductive barrier layer 600. Encapsulation layer 800 is deposited on exposed surfaces of device 10.

It is contemplated by the present inventors that the device 10 can effectively operate without either the first conductive barrier 400 and/or the second conductive barrier 600. When second conductive barrier layer 600 is not used, the at least one conductive rib 520 is disposed directly on transparent electrode 510. When first conductive barrier layer 400 is not used, the transparent electrode 510 is disposed directly on the organic light-emitting stack 300.

The at least one conductive rib 520 and the second conductive barrier 600 occupy a small portion of surface 511 of transparent electrode 510. Surface 511 generally defines the "top" of OLED display device 10, while surface 101 of substrate 100 generally defines the "bottom" of OLED display device 10. Channel 700 serves as the separation between adjacent diodes in the OLED display device 10.

The substrate 100 may be made of soda-lime glass. It is contemplated that the substrate 100 is not limited to glass; rather, the substrate 100 may be formed of silicon or other suitable materials. For example, substrate 100 may comprise a silicon driver chip for active matrix addressing when OLED display device 10 is an active matrix addressed display.

First conductor 200 includes Al. The present invention, however, is not limited to Al; rather other suitable materials for electron injection are considered to be within the scope of the present invention including but not limited to Al and Cu alloy covered with an injection material such as Mg and Ag alloy, Li and Al alloy, LiF on Al, and Sc or $Sc_2O_3$ on Al.

As embodied herein, the organic light-emitting stack 300 includes a water or solvent-soluble organic light-emitting material. Alternatively, the organic light-emitting stack 300 may comprise any of a variety of organic light-emitting materials, including multiple layers of different materials, including materials which emit a variety of colors of light.

The transparent electrode 510 includes In-Sn oxide (ITO). The present invention, however, is not limited to a transparent electrode 510 formed from ITO; rather, it is contemplated that any of a variety of transparent or semi-transparent conductive materials, including but not limited to InZnO or ZnO may be used. A very thin conductor such as Mg+Ag or Al+$L_1$ (typically less than 100 Angstrom) may be used in conjunction with a thicker transparent such as, for example ITO. It is also contemplated that sputtered materials on top of the organic layers (e.g., sputtered thin Al (100 Angstroms) on AlQ or sputtered ITO (2000 Angstroms) on CuPc) may be used and are considered to be within the scope of the present invention. As embodied herein, electrode 510 is transparent to at least a portion of the light emitted by organic light-emitting stack 300 to permit light to escape for viewing.

As embodied herein, the first conductive barrier 400 is a thin, conductive material. First conductive barrier 400 is preferably Sn, but may also be Au or some other high work function material. First conductive barrier layer 400 is preferably 100–200 angstroms thick. The first conductive barrier 400 is preferably thin enough to transmit at least a portion of the light emitted by the organic light-emitting stack 300. The purpose of the first conductive barrier 400 is to minimize oxygen exposure of organic light-emitting stack 300 during deposition of the transparent electrode 510.

As embodied herein, the at least one conductor rib 520 is configured as one or more elongated, narrow lines, or ribs, which preferably covers a relatively small portion of the surface 511 of the electrode 510. By minimizing the plan form area of the at least one conductive rib 520 relative to surface 511, light transmittance from the organic light-emitting stack 300 through the top of OLED display device 10 may be maximized. The at least one conductor rib 520 may form the row or column electrode for several OLEDs along one line of a matrix addressed display.

The at least one conductive rib 520 comprises Mo. The present invention is not limited to a conductive rib 520 formed from Mo; rather it is contemplated that other conductive materials such as Al, Ti, $TiSi_2$ W, and Ta may be used. Furthermore, conductive rib 520 may comprise a composite of two or more materials such as very thin Al (300 Angstroms) and ITO are possible. Preferably, the conductive rib 520 comprises a material that can be easily reactive ion etched (RIE) or plasma etched.

As embodied herein, second conductive barrier 600 comprises a vertically conductive organic film preferably CuPc (copperphthalocyanate). It is contemplated that the second conductive barrier 600 is not limited to CuPc; rather it may comprise polyaniline or other materials that are resistant to the dry etch used in connection with the conductive rib 520. The purpose of the second conductive barrier 600 is to protect the transparent electrode 510 from damage during etching of the at least one conductor rib 520. The second conductor barrier 600 permits conduction via tunneling or a other suitable carrier transport mechanism.

Encapsulation layer 800 comprises SiC. The encapsulation layer 800 is not limited to SiC; rather, it is contemplated that the encapsulation layer 800 may comprise diamond-like carbon or parylene or other suitable materials which are deposited by PECVD. Encapsulation layer 800 may comprise multiple layers of various materials. The encapsulation layer 800 protects the layers of device 10 from exposure to moisture, oxygen, etc.

It is contemplated by the inventors of the present invention that the ordering of the layers of the device can be reversed (i.e., the reflective layers can be on top or bottom). Transparency is achieved when both electrodes are transparent.

A preferred method for making an embodiment of the present invention begins with deposition of first conductor 200 on the surface of substrate 100. The first conductor 200 is preferably patterned using conventional photo resist techniques and solvent lift-off, for example by hot NMP. The first conductor 200 may be deposited using evaporation. Alternatively, the first conductor 200 may be deposited by sputtering. The first conductor 200 is preferably patterned as lines when used in a passively addressed display, or as pads for connecting from an active matrix array of transistors and capacitors.

As embodied herein, the upper surface of the first conductor 200 is ion beam cleaned. When the first conductor 200 is transferred with substrate 100 during the manufacturing process, it is maintained in an inert gas environment to avoid surface oxidation. Ar gas is preferably employed to maintain an inert gas environment around the upper surface of first conductor 200. In general, exposure to air is preferably avoided during all manufacturing steps of the device 10 where the organic light-emitting stack 300 or first conductor 200 or second conductor 500 are exposed. Surface oxidation at the interface of the various layers of the device 10 may cause defects, delamination, or loss of efficiency and/or may limit the life of the device.

The organic light-emitting stack 300 is then deposited on first conductor 200 by thermal evaporation. Deposition of the organic light-emitting stack 300 is preferably carried out in situ without breaking vacuum following the deposition and patterning of first conductor 200. This minimizes the potential for surface oxidation. Color organic light emitting materials comprising organic light-emitting stack 300 may be shadow mask-deposited to create color cells. In Alternatively, dry lithography may be used to create color cells and organic light-emitting stack 300. Dry plasma deposited and developed photo resists may be employed to define color cells in organic light-emitting stack 300. Shadow masking is preferably used to provide perimeter openings in organic light-emitting stack 300 for backside connections where needed.

In embodiments of the invention where many small contacts between first conductor 200 and circuitry in substrate 100 are required, dry plasma photo resist processing is preferably used to define contact holes, followed by plasma etching or RIE of the contact holes. Alternatively, wet etching may be used. For example, BOE may be employed for wet etching $SiO_2$ insulator contacts, where BOE is 1 part 49% HF and 10 parts 40% ammonium biflouride solution in water.

Next, the transparent electrode 510 is deposited on the upper surface of the organic light-emitting stack 300. The transparent electrode 510 preferably comprises ITO. Sputtering is preferably used to deposit the transparent electrode 510. Depending on the material selected for the transparent electrode 510, other appropriate deposition techniques such as evaporation may be employed. The substrate 100 (and the existing deposited layers) is transferred to a deposition apparatus in an inert gas environment for deposition of the transparent electrode 510. $N_2$ gas is used, but other suitable gasses such as Ar may be employed.

First conductive barrier 400 is deposited on the upper surface of organic light-emitting stack 300 before deposition of the transparent electrode 510. First conductive barrier 400 preferably comprises a thin conductor barrier which serves to minimize oxygen exposure to organic light-emitting stack 300 during deposition of the transparent electrode 510. As embodied herein, first conductive barrier 400 comprises a thin (20–100 angstrom) layer of Sn deposited by sputtering. The first conductive barrier 400 may comprise ITO, Pt, Au or other high work function materials.

The at least one conductor rib 520 is next deposited on the surface of the transparent 510. The at least one conductive rib 520 is preferably comprises Mo, preferably deposited by sputtering. Other suitable deposition techniques, however, such as chemical vapor deposition (CVD) may be used. As embodied herein, second conductive barrier layer 600 is deposited on the surface of the transparent electrode 510 prior to deposition of the conductor rib 520. Second conductive barrier 600, which preferably comprises a conductive organic film, serves to protect the transparent electrode 510 during etching. As embodied herein, when second conductive barrier 600 comprises a conductive organic film, the film is deposited by evaporation. When other materials are used to form second conductive barrier 600, other suitable deposition techniques may be employed.

The at least one conductor ribs 520 is photolithographically patterned into ribs, or lines, as for use in a matrix addressed display. Conventional plasma dry resist processes may be used to pattern the conductor rib 520. The conductor rib 520 is next dry etched used $CF_4$, when the conductor is Mo. Other etch methods may be employed as appropriate for the metal forming the conductor rod 520. Resist removal using $O_2$ RIE is optional at this step, depending upon the particular dry resist employed.

Channel 700 is formed in the upper surface of OLED display device 10. To form channel 700, the transparent electrode 510 is first photolithographically patterned using conventional dry plasma resist processes. As embodied herein, when the electrode 510 comprises ITO, a photoresist process is preferably employed. As embodied herein, the patterned electrode 510 is then dry etched using RIE. Alternatively, depending on its material, patterned electrode 510 may be plasma etched using $CH_4$. Next, the resist is preferably removed using plasma or low-power RIE employing $O_2$, depending on the material of electrode 510. When electrode 510 is ITO, $O_2$ RIE is preferably employed. The dry etch process to form channel 700 is preferably continued through to first conductive barrier 400 and into organic light-emitting stack 300 as deep as is desired, but preferably not into first conductor 200.

Lastly, as embodied herein, encapsulation layer 800 is formed on the exposed surfaces of OLED display device 10, preferably without any exposure to air. Encapsulation layer 800, which preferably comprises SiC, is preferably deposited using the plasma enhanced chemical vapor deposition (PECVD) method. As noted above, encapsulation layer 800 may comprise multiple layers of various materials. Appropriate deposition methods that are known in the art may be used as appropriate for a given encapsulation layer material.

Figure 2:
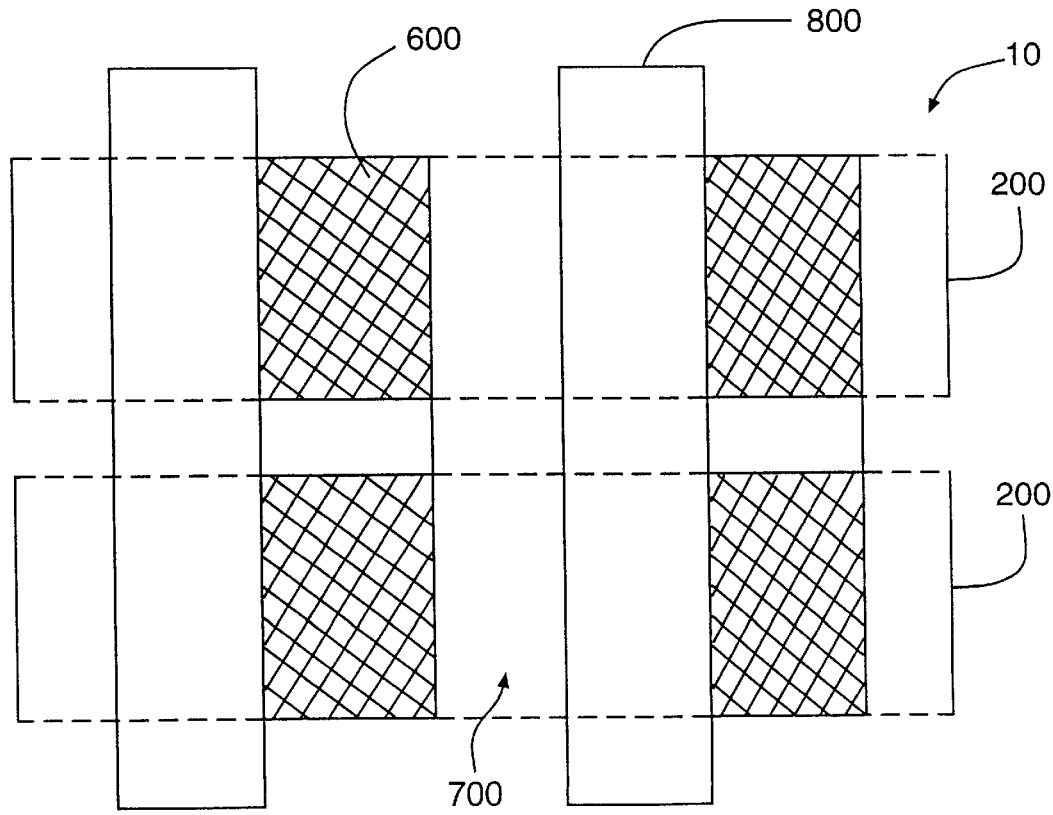
FIG. 2 is a top plan form view of the display device of FIG. 1.

Reference is now had to FIG. 2, which shows a topside, or plan view, of OLED display device 10 shown in FIG. 1. The at least one conductor rib 510 comprise vertical conductor lines, each common to all of the display pixels 620 in that line, or display column. Similarly, first conductors 200 comprise horizontal conductor lines each common to all of the display pixels 620 in that line, or display row. Channel 700 separates adjacent columns of conductor ribs 520 and pixels 620. FIG. 2 depicts display pixels 620 arranged in an array of parallel columns of conductor ribs 520 and rows of parallel first conductors 200, to from a matrix addressed display.

When the associated first conductor 200 and at least one conductor rib 520 of a given pixel 620 are both activated, the organic material comprising the pixel emits light.

Figure 3:
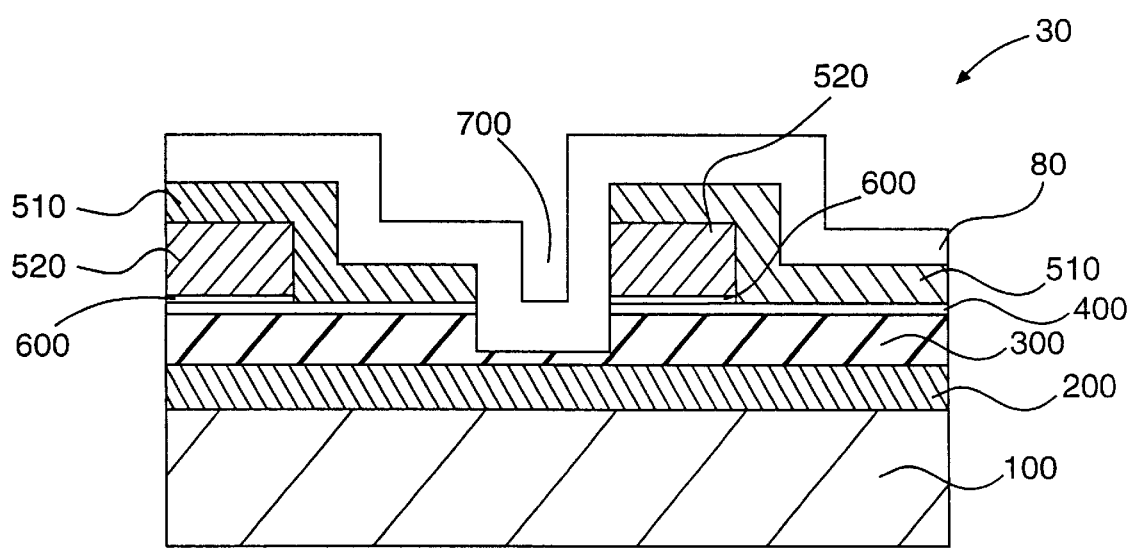
FIG. 3 is a cross-sectional side view and elevation of an alternate preferred embodiment of an OLED display device of the present invention showing four pixels.

Reference is now had to FIG. 3, which shows an alternative embodiment of the present invention. The components and structure of OLED display device 30 are preferably similar to that of the OLED display device 10 shown in FIG. 1, except that the relative positions of the at least one conductive rib 520 and the transparent electrode 510 in the layered structure are reversed. The at least one conductor rib 520 is formed on the first conductive barrier 400 and the second conductive barrier 600. The transparent electrode 510 is disposed on the conductive rib 520 as well as on the remaining exposed surface of first conductive barrier 400. This embodiment of the invention has the advantage of not exposing ITO to the metal etch out.

In the method for making OLED display device 30, conductor ribs 520 are deposited, patterned and etched as described previously, except that the ribs 520 are deposited on first conductive barrier 400. Next, the transparent electrode 510 is deposited, patterned and etched, as previously described, to form channel 700. Second conductive barrier 600 is preferably deposited on first conductive barrier 400 before deposition of the conductive ribs 520. Second conductive barrier 600 is of greater importance in this embodiment of the invention as it may help to avoid damage to organic light-emitting stack 300 during etch of the conductive rib 520. In this embodiment of the invention, the composition of the various layers of OLED display device 30 are the same as those described previously for OLED display device 10 in FIG. 1.

In various preferred embodiments of the invention, by patterning the at least one conductive rib 520 to form a sufficiently narrow line, the size of pixels 620 may be maximized to permit a low line resistance and a high transmittance of the light-emitted by organic light-emitting stack 300. The invention thus provides high light output in a high resolution display device.

It will be apparent to those skilled in the art that various modifications and variations can be made in the construction, configuration, and/or operation of the present invention without departing from the scope or spirit of the invention. For example, in the embodiments mentioned above, various changes may be made to the materials used for, as well as the processes used to deposit, the various layers of the display device. Variations in the structure of the organic light-emitting stack itself, including numbers and types of layers, as well as variations in the numbers and groupings of individual pixels in the OLED display, may also be made without departing from the scope and spirit of the invention. Thus, it is intended that the present invention cover the modification and variations of the invention provided they come within the scope of the appended claims and their equivalents.

What is claimed is:

1. In an organic light emitting diode device comprising a substrate, a first conductor located on said substrate, an organic light emitting layer located on said first conductor, and a second conductor located on said organic light emitting layer, the improvement comprising:

said second conductor having a transparent electrode layer, wherein said transparent electrode layer having a surface, and at least one conductive rib disposed along a narrow portion of said surface on said transparent electrode layer;

a first conductive barrier located between said transparent electrode layer and said at least one conductive rib; and a second conductive barrier located between said organic light emitting layer and said transparent electrode.

2. The device according to claim 1, wherein said at least one conductive rib is formed from a highly conductive material.

3. The device according to claim 2, wherein said highly conductive material is formed from at least one material selected from the group consisting of at least one material selected from the group consisting of Mo, Ti, TiSi$_2$, W, Ta, Al and alloys of Mo, Ti, TiSi$_2$, W, Ta, and Al.

4. The device according to claim 1, wherein said transparent electrode layer comprises at least one material selected from the group consisting of InSnO, InZnO, and ZnO.

5. The device according to claim 1, further comprising:

an encapsulation layer formed on said transparent electrode layer and said at least one conductive rib.

6. The device according to claim 5, wherein said encapsulation layer is formed from a material selected from the group consisting of SiC, diamond-like carbon and parylene.

7. The device according to claim 6, wherein said material is deposited by PECVD.

8. The device according to claim 1, wherein said first conductor layer is formed from at least one material selected from the group consisting of Al, Cu and alloys of Al and Cu.

9. The device according to claim 8, wherein said first conductor layer further includes an electron injection layer.

10. The device according to claim 9, wherein said electron injection layer includes an injection material selected from the group consisting of alloys of Mg and Ag, alloys of Li and Al, LiF on Al, Sc on Al, and Sc$_2$O$_3$ on Al.

11. The device according to claim 10, wherein said first conductor layer further includes a reflective layer.

12. A display device comprising:

at least one organic light emitting diode device, wherein each of said at least one organic light emitting diode device comprises;

a substrate;

a first conductor located on said substrate;

an organic light emitting layer located on said first conductor;

a second conductor located on said organic light emitting layer, wherein said second conductor comprises a transparent electrode layer, wherein said transparent electrode layer having a surface, and at least one conductive rib disposed along a narrow portion of said surface on said transparent electrode layer;

a first conductive barrier located between said transparent electrode layer and said at least one conductive rib; and a second conductive layer located between said transparent electrode layer and said organic light emitting layer.

13. The display device according to claim 12, wherein said at least one conductive rib is formed from a highly conductive material.

14. The display device according to claim 13, wherein said highly conductive material is formed from at least one material selected from the group consisting of at least one material selected from the group consisting of Mo, Ti, TiSi$_2$, W, Ta, Al and alloys of Mo, Ti, TiSi$_2$, W, Ta, and Al.

15. The device according to claim 12, wherein said transparent electrode layer comprises at least one material selected from the group consisting of InSnO, InZnO, and ZnO.

16. The device according to claim 12, wherein said device includes at least two organic light emitting diode devices, wherein said at least one of said first conductor and said second conductor are common to at least two of said organic light emitting diode devices.

17. The device according to claim 12, wherein said device includes at least two organic light emitting diode devices, wherein said second conductor is common to at least two of said organic light emitting diode devices.

18. The device according to claim 12, further comprising:

an encapsulation layer formed on said transparent electrode layer and said at least one conductive rib.

19. The device according to claim 18, wherein said encapsulation layer is formed from a material selected from the group consisting of SiC, diamond-like carbon and parylene.

20. The device according to claim 19, wherein said material is deposited by PECVD.

21. The device according to claim 12, wherein said first conductor layer is formed from at least one material selected from the group consisting of Al, Cu and alloys of Al and Cu.

22. The device according to claim 12, wherein said first conductor layer further includes an electron injection layer.

23. The device according to claim 22, wherein said electron injection layer includes an injection material selected from the group consisting of alloys of Mg and Ag, alloys of Li and Al, LiF on Al, Sc on Al, and Sc$_2$O$_3$ on Al.

24. The device according to claim 23, wherein said first conductor layer further includes a reflective layer.

* * * * *